US011606859B2

(12) United States Patent
Iwase

(10) Patent No.: US 11,606,859 B2
(45) Date of Patent: Mar. 14, 2023

(54) STRETCHABLE CIRCUIT BOARD

(71) Applicant: NIPPON MEKTRON, LTD., Tokyo (JP)

(72) Inventor: Masayuki Iwase, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 17/468,343

(22) Filed: Sep. 7, 2021

(65) Prior Publication Data

US 2022/0201849 A1  Jun. 23, 2022

(30) Foreign Application Priority Data

Dec. 23, 2020 (JP) .............................. JP2020-213586

(51) Int. Cl.
*H05K 1/09* (2006.01)
*H05K 1/02* (2006.01)

(52) U.S. Cl.
CPC ......... *H05K 1/0283* (2013.01); *H05K 1/0265* (2013.01); *H05K 1/09* (2013.01)

(58) Field of Classification Search
CPC .......... H05K 1/077; H05K 1/083; H05K 1/09; H05K 1/0265
See application file for complete search history.

(56) References Cited

U.S. PATENT DOCUMENTS

2017/0099730 A1   4/2017 Iwase
2018/0283844 A1*  10/2018 Kamakura ............... G01B 7/18

FOREIGN PATENT DOCUMENTS

JP        2017-069530 A     4/2017

* cited by examiner

*Primary Examiner* — Jeremy C Norris
(74) *Attorney, Agent, or Firm* — Studebaker & Brackett PC

(57) ABSTRACT

A stretchable circuit board includes a stretchable base material; a stretchable conductive pattern formed on at least one main surface of the stretchable base material and having stretchability; and a reinforcing base having higher rigidity than the stretchable base material, wherein the reinforcing base reinforces the stretchable base material by being directly or indirectly laminated on the stretchable base material so as to surround at least a part of a formation region of the stretchable conductive pattern in the stretchable base material in a plan view.

12 Claims, 7 Drawing Sheets

STRETCHABLE CIRCUIT BOARD

CROSS-REFERENCE TO RELATED APPLICATION

This application claims priority from Japanese Patent Application No. 2020-213586 filed with the Japan Patent Office on Dec. 23, 2020, the entire content of which is hereby incorporated by reference.

BACKGROUND

1. Technical Field

One aspect of the present disclosure relates to a stretchable circuit board.

2. Related Art

The stretchable circuit board is described in, for example, JP-A-2017-069530.

The stretchable circuit board described in JP-A-2017-069530 includes a stretchable base material, a stretchable conductive pattern, a reinforcing base, a reinforcing area, and a stretchable area. The stretchable conductive pattern is formed on at least one main surface of the stretchable base material and has stretchability. The reinforcing base has higher in-plane rigidity than the stretchable base material. The stretchable area has lower in-plane rigidity than the reinforcing area and has stretchability. The reinforcing area is a region where the reinforcing base is provided. The stretchable area is a region where the reinforcing base is not provided.

The stretchable circuit board described in JP-A-2017-069530 is used by being attached to a human body, a robot, various devices, apparatuses, and objects to be attached such as a wearable goods. The stretchable circuit board deforms according to movement of the objects to be attached and irregularities of a surface.

SUMMARY

A stretchable circuit board includes a stretchable base material; a stretchable conductive pattern formed on at least one main surface of the stretchable base material and having stretchability; and a reinforcing base having higher rigidity than the stretchable base material, wherein the reinforcing base reinforces the stretchable base material by being directly or indirectly laminated on the stretchable base material so as to surround at least a part of a formation region of the stretchable conductive pattern in the stretchable base material in a plan view.

DESCRIPTION OF THE EMBODIMENTS

Figure 1:
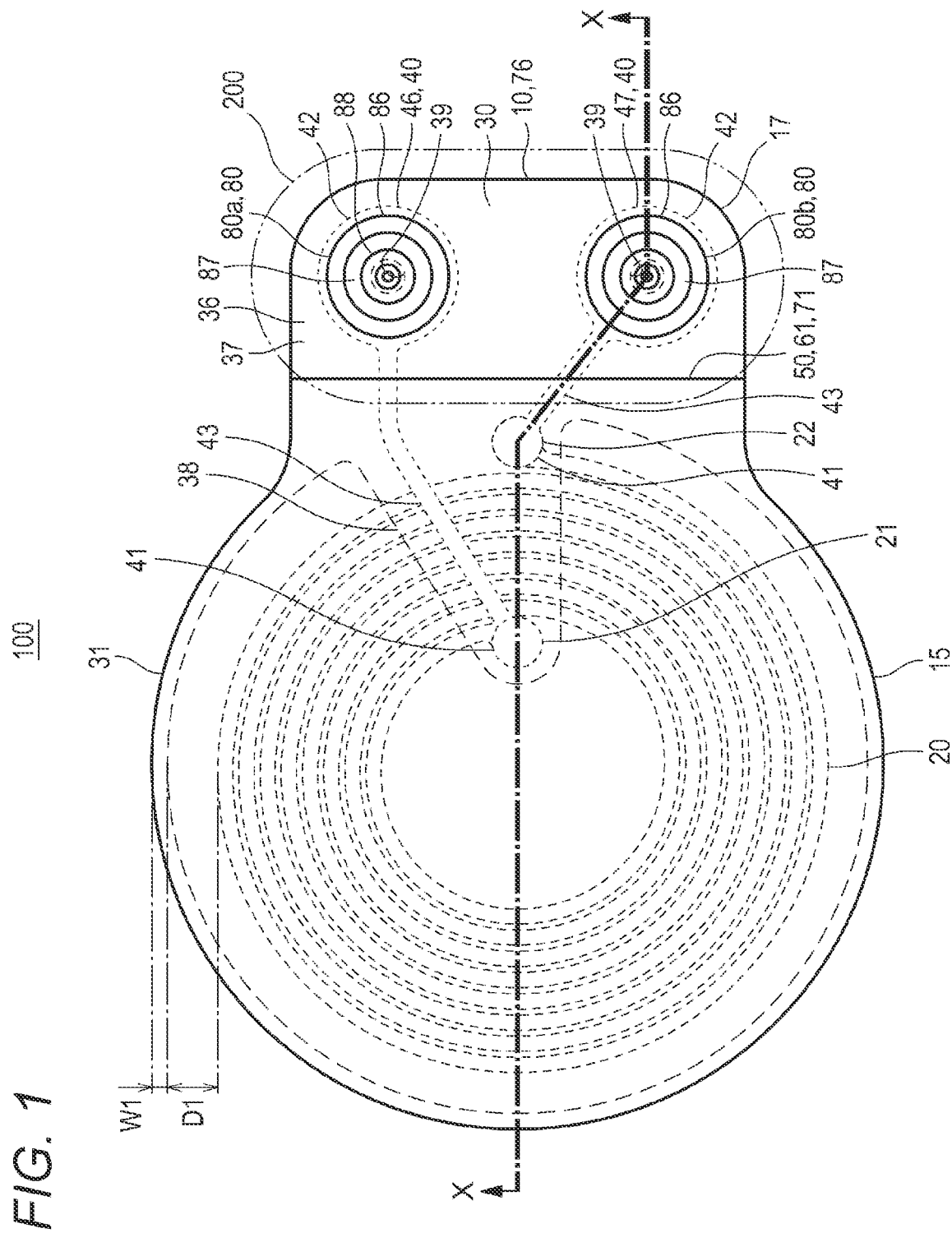
FIG. 1 is a schematic plan view illustrating a stretchable circuit board according to a first embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A stretchable circuit board described in JP-A-2017-069530 still has room for improvement in handleability of the stretchable circuit board during attachment of the stretchable circuit board.

A stretchable circuit board (the present stretchable circuit board) according to one aspect of the present disclosure includes:
a stretchable base material:
a stretchable conductive pattern formed on at least one main surface of the stretchable base material and having stretchability; and
a reinforcing base having higher rigidity than the stretchable base material (for example, in-plane rigidity), wherein
the reinforcing base reinforces the stretchable base material by being directly or indirectly laminated on the stretchable base material so as to surround at least a part of a formation region of the stretchable conductive pattern in the stretchable base material in a plan view.

According to the present stretchable circuit board, it is possible to improve the handleability of the stretchable circuit board during attachment of the stretchable circuit board.

First Embodiment

Hereinafter, a first embodiment of the present disclosure will be described with reference to FIGS. 1 to 6. In all the drawings, the same components are denoted by the same reference numerals, and description thereof will be omitted as appropriate. Further, FIGS. 2 and 3 illustrate cut end surfaces of a stretchable circuit board 100 along a line X-X of FIG. 1.

Figure 2:
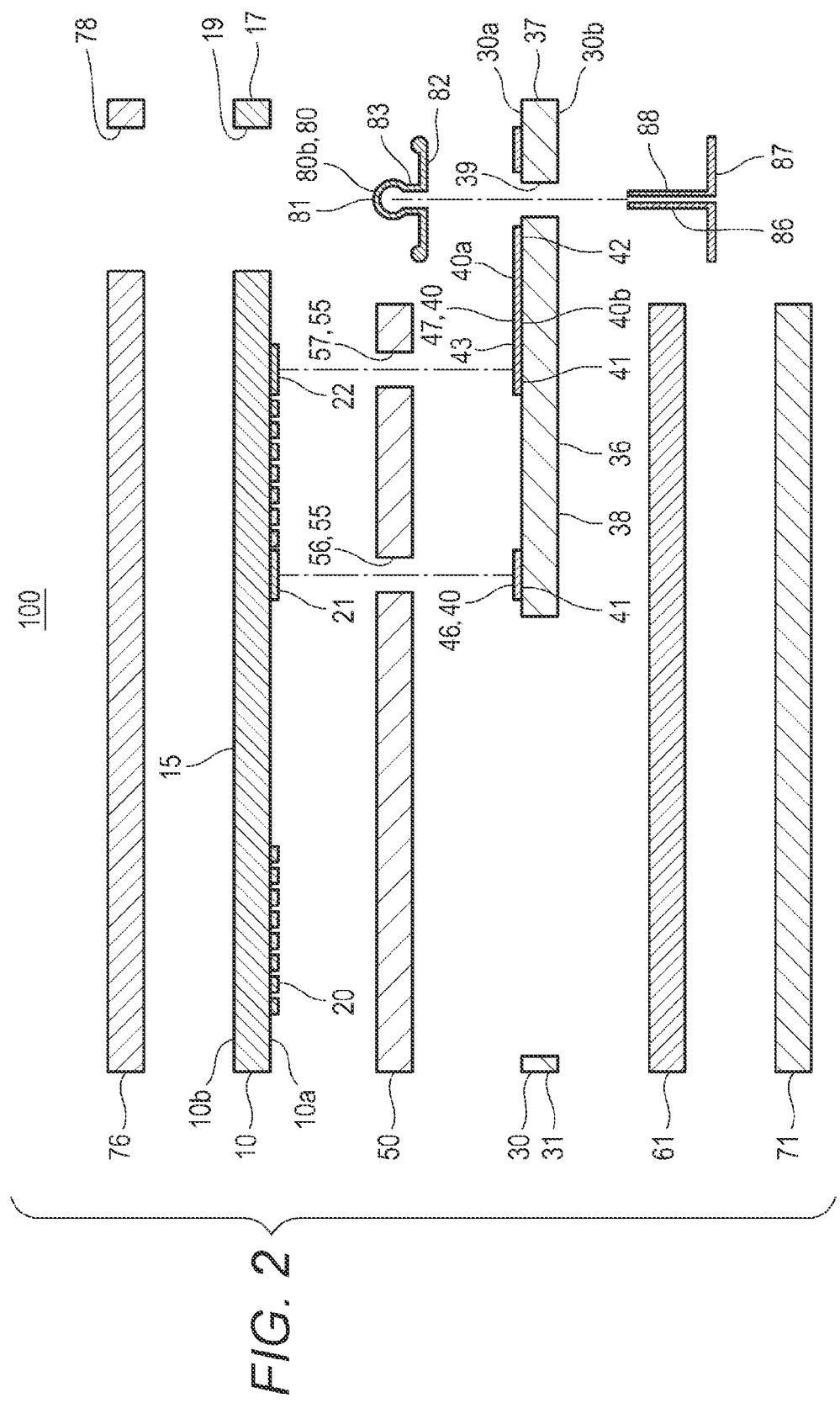
FIG. 2 is a schematic exploded end view illustrating the stretchable circuit board according to the first embodiment.
Figure 3:
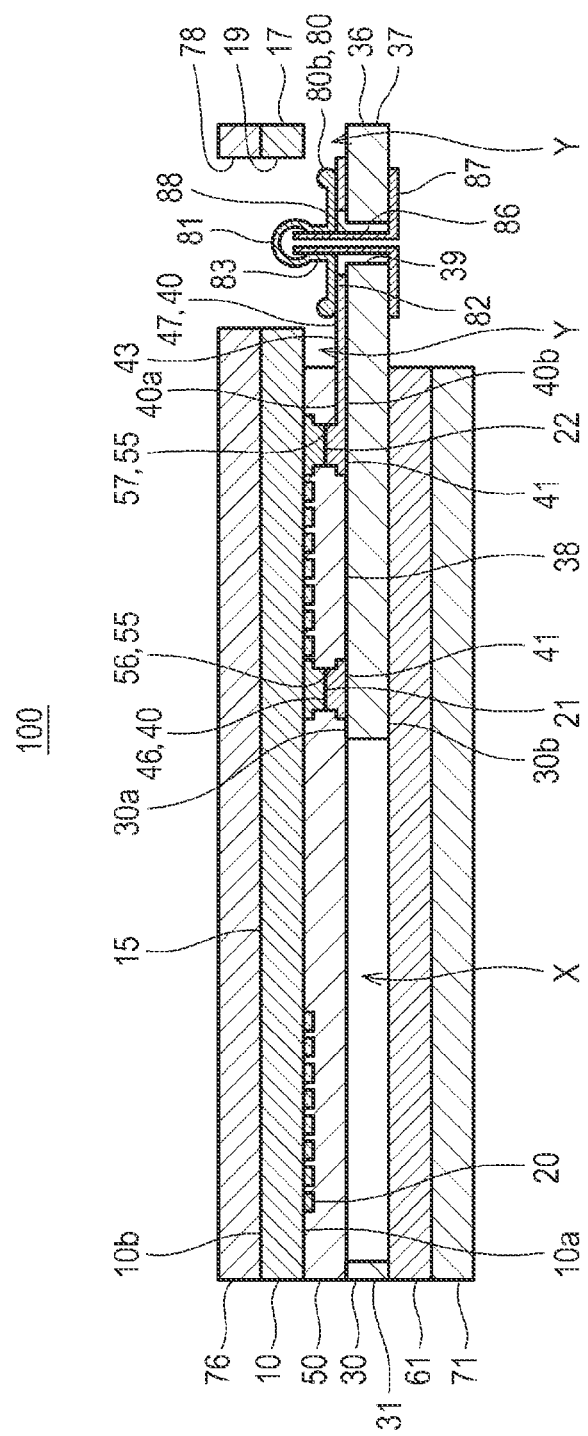
FIG. 3 is a schematic end view illustrating the stretchable circuit board according to the first embodiment.

As illustrated in FIGS. 1 and 2, the stretchable circuit board 100 according to the present embodiment includes: a stretchable base material 10; a stretchable conductive pattern 20 formed on at least one main surface 10a of the stretchable base material 10 and having stretchability; and a reinforcing base 30 having higher rigidity than the stretchable base material 10.

The reinforcing base 30 reinforces the stretchable base material 10 by being indirectly laminated on the stretchable base material 10 so as to surround at least a part of a formation region of the stretchable conductive pattern 20 in the stretchable base material 10 in a plan view.

Here, the rigidity of the reinforcing base 30 is a product (E 1) of Young's modulus (E) and second moment of area ( ). Then, "having high rigidity" means at least one of being hard to be deformed by a bending load in a direction intersecting a surface direction, that is, having high flexural rigidity, and of being hard to be deformed by a tensile stress in an in-plane direction. The reinforcing base 30 preferably has high rigidity in both of these meanings.

Further, "reinforcing" of the reinforcing base 30 means to partially reinforce the rigidity of the entire stretchable base material 10, to give stiffness to the stretchable base material 10. "Reinforcing" also means to partially reinforce rigidity of a member corresponding to the stretchable base material 10 in the stretchable circuit board 100.

Further, "at least a part of a formation region of the stretchable conductive pattern 20 in the stretchable base material 10" may be the whole or a part of the formation region. When at least a part of the formation region of the stretchable conductive pattern 20 in the stretchable base material 10 is surrounded by the reinforcing base 30, the formation region of the stretchable conductive pattern 20 in the stretchable base material 10 may include a portion that overlaps the reinforcing base 30, may include a portion that projects outward from the reinforcing base 30, or may include both of them.

Further, "surround" means that the reinforcing base 30 surrounds the periphery of the formation region of the stretchable conductive pattern 20 in the stretchable base material 10 over a range of at least 180 degrees or more.

The stretchable circuit board 100 is used by being attached to a target surface of an object. In the case of the present embodiment, the stretchable circuit board 100 is used by being attached to a skin surface 300 (see FIG. 6), which is a desired portion in a human living body. The skin surface 300 is a curved surface having irregularities, and deforms (for example, stretched and shrunk) due to stretching and contracting of a muscle, flexion of a joint, or the like.

Here, the stretchable base material 10 is a thin film sheet material having two main surfaces (in the case of the present embodiment, the one main surface 10a and the other main surface 10b) from the viewpoint of achieving a fit to the skin surface 300. In a state where the stretchable circuit board 100 is attached to the skin surface 300, the stretchable base material 10 stretches and contracts and bends according to the irregularities and deformation of the skin surface 300. Further, the stretchable conductive pattern 20 having stretchability is also deformed as the stretchable base material 10 stretches and contracts and bends.

Note that the stretchable circuit board 100 is not limited to being used by being attached to the skin surface 300, and may be used by being attached to, for example, a living body's nail, clothes, robots, various devices, apparatuses, wearable goods, and the like.

According to the present embodiment, the reinforcing base 30 reinforces the stretchable base material 10 so as to surround at least a part of the formation region of the stretchable conductive pattern 20 in the stretchable base material 10 in a plan view.

Thus, sufficient shape retention of the stretchable base material 10 can be ensured. Therefore, in a stage before the stretchable circuit board 100 is attached to the skin surface 300, at least in the formation region of the stretchable conductive pattern 20 in the stretchable base material 10, the main surface of the stretchable base material 10 can be sufficiently maintained in an unfolded state in the surface direction. Therefore, it is easy to place the stretchable circuit board 100 on the skin surface 300 so that the main surface of the stretchable base material 10 follows the skin surface 300 while suppressing occurrence of wrinkles and twists in the stretchable base material 10. Therefore, for example, it is possible to suppress the stretchable circuit board 100 from being unintentionally attached to a palm or a finger of a user, and to suppress parts of the stretchable circuit board 100 from being attached to each other.

As described above, according to the present embodiment, it is possible to improve the handleability of the stretchable circuit board during the attachment of the stretchable circuit board 100.

In the case of the present embodiment, the stretchable circuit board 100 is, for example, a near field communication (NFC) tag, and is used for NFC communication with an external device (not illustrated). However, the stretchable circuit board 100 is, for example, a radio frequency identifier (RFID) tag, and may be used for RFID communication.

Figure 6:
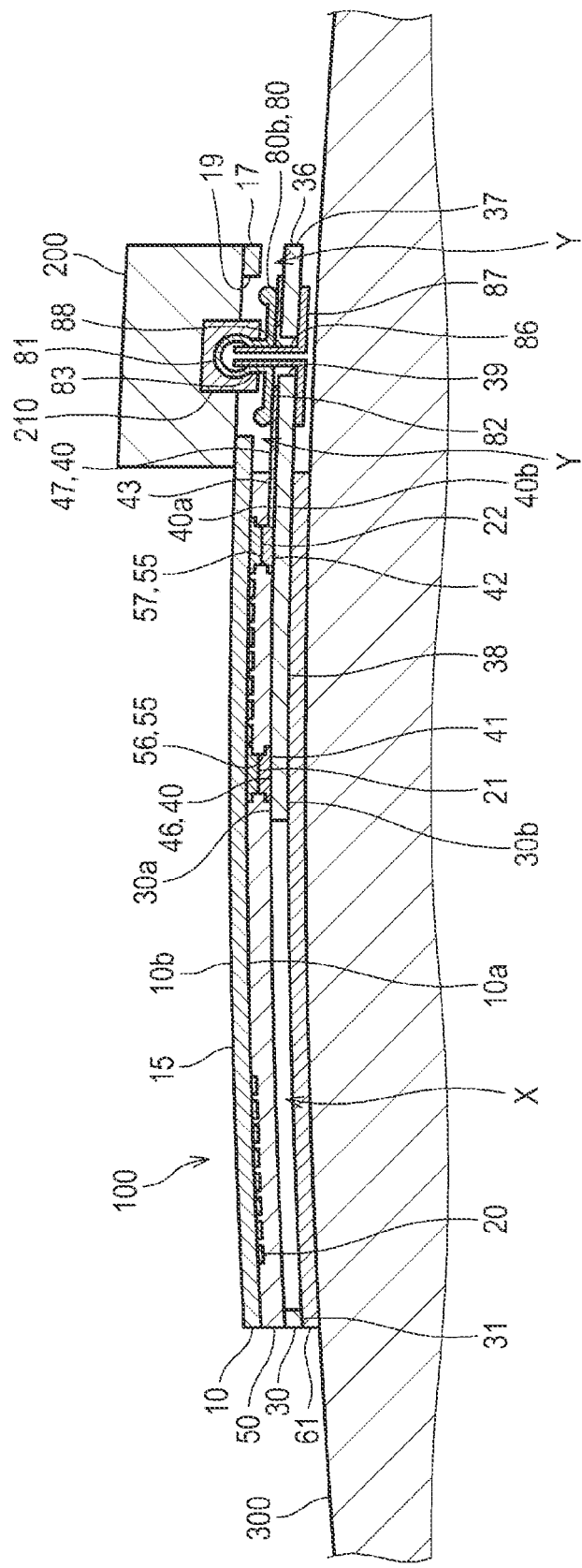
FIG. 6 is a schematic end view for explaining an example of how to use the stretchable circuit board according to the first embodiment.

Further, as illustrated in FIG. 6, the stretchable circuit board 100 is, for example, used by being connected to a sensor 200. The sensor 200 may be, for example, a biological sensor that detects a weak biological signal such as brain wave, myoelectric potential, or electrocardiographic signal for detecting biological information such as an electrocardiogram, a heart rate, a blood pressure, or a body temperature. Alternatively, the sensor 200 may be an acceleration sensor, a gyro sensor, or the like that detects movement (acceleration) of a living body over multiple axes. In FIG. 1, the sensor 200 is indicated by a two-dot chain line. Further, in FIG. 6, a shape of the sensor 200 is schematically illustrated.

Note that in the present embodiment, the stretchable circuit board 100 may be used by being connected to devices other than the sensor 200, such as a power supply, a control circuit board, and a monitor.

Hereinafter, in explaining a positional relationship between components of the stretchable circuit board 100, an upper side in FIG. 3 is referred to as an upper side, and the opposite side is referred to as a lower side. However, definition of these directions is for convenience, and does not limit a direction of the stretchable circuit board 100 during manufacture or use.

As illustrated in any of FIGS. 1 to 3, the stretchable circuit board 100 is a laminate formed in a flat plate shape or a sheet shape. More specifically, the stretchable circuit board 100 further includes, for example, a stretchable cover layer 50, an adhesive layer 61, a first release film 71, and a second release film 76, in addition to the stretchable base material 10, the stretchable conductive pattern 20 and the reinforcing base 30.

In the case of the present embodiment, the adhesive layer 61 is directly laminated on the first release film 71. The reinforcing base 30 is directly laminated on the adhesive layer 61. Further, the stretchable cover layer 50 is directly laminated on the reinforcing base 30. The stretchable base material 10 is directly laminated on the stretchable cover layer 50. Further, the second release film 76 is directly laminated on the stretchable base material 10.

The stretchable base material 10, the reinforcing base 30, and the second release film 76 have the same outer shape. Similarly, the stretchable cover layer 50, the adhesive layer 61, and the first release film 71 have the same outer shape. However, as illustrated in FIG. 1, each of the outer shapes of the stretchable cover layer 50, the adhesive layer 61, and the first release film 71 has a shape partially missing from each of the outer shapes of the stretchable base material 10, the reinforcing base 30, and the second release film 76. Therefore, as illustrated in FIG. 3, the stretchable circuit board 100 includes: a six-layer structure region where six layers of the second release film 76, the stretchable base material 10, the stretchable cover layer 50, the reinforcing base 30, the adhesive layer 61, and the first release film 71 are laminated to each other; and a three-layer structure region where three layers of the second release film 76, the stretchable base material 10, and the reinforcing base 30 are laminated to each other (a region where the stretchable cover layer 50, the adhesive layer 61, and the first release film 71 are not laminated). Note that in FIGS. 3 and 6, in the drawing description, there is a gap X between the stretchable cover layer 50 and the adhesive layer 61 in an inner region of a surrounding portion 31 to be described below. However, in reality, the stretchable cover layer 50 and the adhesive layer 61 are laminated and in close contact to each other in the inner region. Therefore, the gap X disappears. Similarly, in FIGS. 3 and 6, in the drawing description, there is a gap Y between the stretchable base material 10 and the reinforcing base 30 and/or a draw-out wiring 40 in a peripheral edge portion of an opening 19 to be described below. However, in reality, the stretchable base material 10 and the reinforcing base 30 and/or the draw-out wiring 40 are laminated and in close contact to each other in the peripheral edge portion. Therefore, the gap Y disappears.

Figure 5:
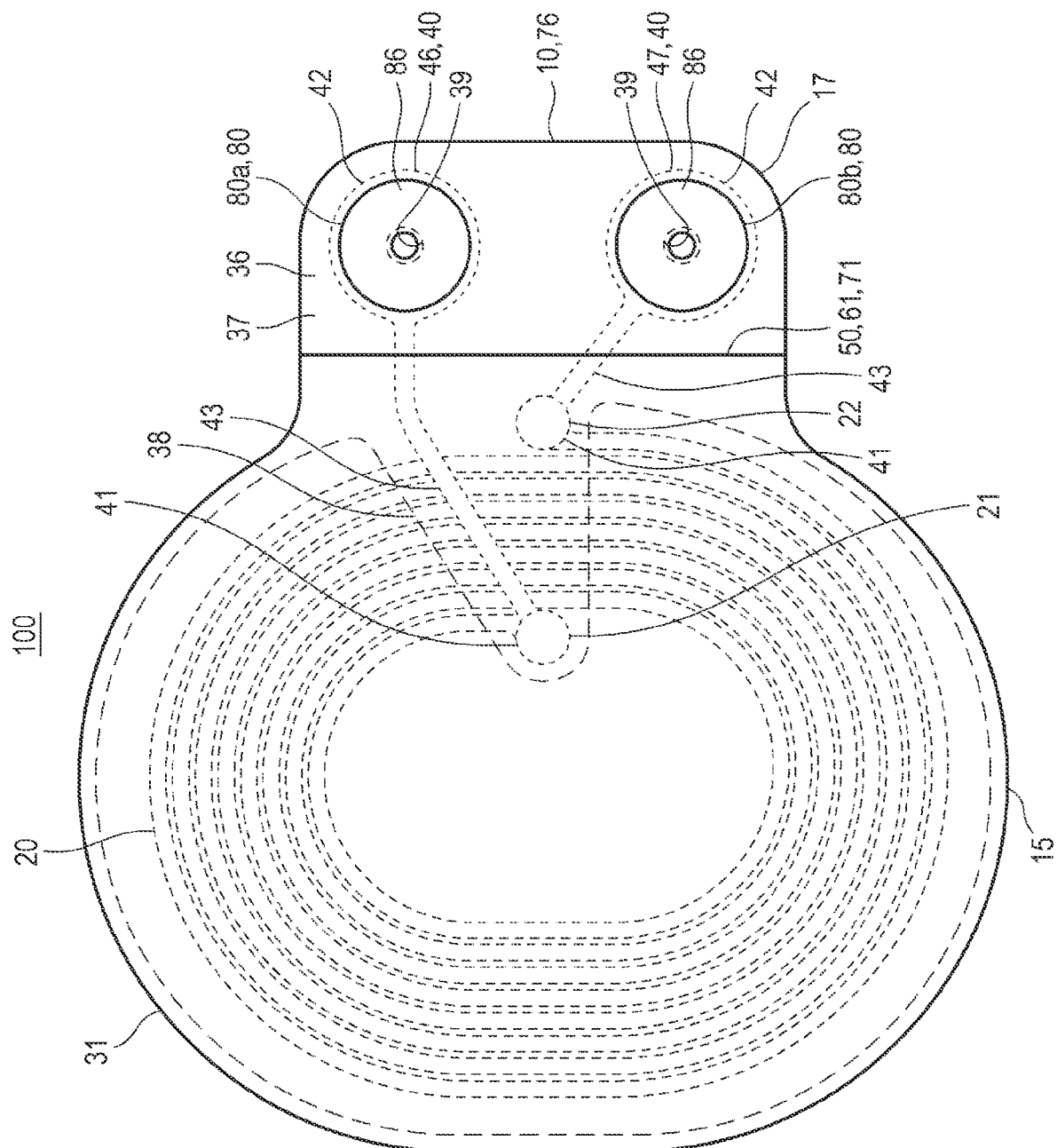
FIG. 5 is a schematic plan view illustrating the stretchable circuit board according to the first embodiment, and illustrates a state in which the stretchable circuit board is extended in one direction.

As illustrated in FIG. 5, the stretchable base material 10 is a thin film sheet material capable of stretching and contracting in at least one direction in the in-plane direction. The stretchable base material 10 can preferably stretch in two directions in the in-plane direction. The stretchability of the stretchable base material 10 in the in-plane direction may be isotropic or anisotropic. Anisotropic stretchability of the stretchable base material 10 in the in-plane direction means that the stretchability of the stretchable base material 10 in a plurality of in-plane directions is different from each other. Note that the stretchability referred to herein means a property that tension acts on the stretchable base material 10 to extend the stretchable base material 10 and the stretchable base material 10 stretches due to a compressive force. In the stretchable base material 10, change in size and shape due to stretching is larger than that due to contraction.

A material constituting the stretchable base material 10 is not particularly limited, and examples thereof include elastomer materials such as nitrile rubber, latex rubber, and urethane-based elastomer. Specifically, by using a urethane-based elastomer sheet used for medical purposes as the stretchable base material 10, high safety can be obtained even when the stretchable circuit board 100 is attached to the skin surface 300 of a human body.

A thickness dimension of the stretchable base material 10 is not particularly limited. However, from the viewpoint of not easily hindering stretching and contracting movement of the skin surface 300, the thickness dimension of the stretchable base material 10 is preferably, for example, 50 μm or less, and more preferably 5 μm or less.

By setting the thickness dimension of the stretchable base material 10 in this way, wearing feeling of the stretchable circuit board 100 is improved. Further, when the used stretchable circuit board 100 is peeled off from the skin surface 300, it is possible to prevent sticking marks of the stretchable circuit board 100 from temporarily remaining on the skin surface 300. Note that as described above, the stretchable base material 10 is reinforced by the reinforcing base 30. Therefore, even when the thickness dimension of the stretchable base material 10 is set to 5 μm or less, the main surface of the stretchable base material 10 can be satisfactorily maintained in an unfolded state in the surface direction in the stage before the stretchable circuit board 100 is attached to the skin surface 300.

The maximum elongation rate of the stretchable base material 10 is preferably 10% or more, more preferably 50% or more, further preferably 100% or more, and particularly preferably 200% or more. The stretchable base material 10 configured as described above can exhibit, for example, the maximum elongation rate of 300% or more. Here, the maximum elongation rate of the stretchable base material 10 means the maximum value of an elongation rate on elastic deformation in one direction in the in-plane direction.

Note that in the present embodiment, the elongation rate means a ratio of an amount of elongation in one direction in the in-plane direction due to application of a force to the dimension (dimension of elongation rate of 0%) when no external force is applied. For example, an elongation rate of 50% is 1.5 times the elongation rate of the dimension of elongation rate of 0%, and a 100% elongation rate is twice the elongation rate of the dimension of elongation rate of 0%.

As illustrated in FIG. 1, the stretchable base material 10 includes, for example, a circular portion 15 formed in a circular shape in a plan view and a rectangular portion 17 formed in a substantially rectangular shape in a plan view.

Since the circular portion 15 is formed in a circular shape in a plan view, it is possible to realize substantially isotropic stretchability at least in the circular portion 15.

The rectangular portion 17 locally projects, for example, from a part of a peripheral edge portion of the circular portion 15 outward in a radial direction of the circular portion 15. The rectangular portion 17 is, for example, elongated in a direction perpendicular to a projecting direction of the rectangular portion 17. The dimension of the rectangular portion 17 in the longitudinal direction is set to be smaller than an outer diameter of the circular portion 15.

For example, the stretchable conductive pattern 20 is formed in the circular portion 15. The stretchable conductive pattern 20 can be deformed by following the stretching and contracting of the circular portion 15.

In the case of the present embodiment, at least a part of the stretchable conductive pattern 20 is, for example, a coil wiring formed in a spiral shape.

Further, the stretchable conductive pattern 20 is, for example, an antenna pattern that functions as an antenna.

That is, in the case of the present embodiment, the stretchable conductive pattern 20 is not only the coil wiring but also the antenna pattern. However, the stretchable conductive pattern 20 may be, for example, either the coil wiring or the antenna pattern. The function (configuration) of the stretchable conductive pattern 20 can be appropriately set according to application of the stretchable circuit board 100.

The stretchable circuit board 100 transmits electric power energized via the stretchable conductive pattern 20 (coil wiring), for example, by the external device (not illustrated) to the sensor 200.

Further, the stretchable conductive pattern 20 (antenna pattern) transmits and receives signals, for example, to and from the external device. More specifically, the stretchable conductive pattern 20 transmits a signal input from the sensor 200 to the external device. Further, the stretchable conductive pattern 20 inputs a signal or a radio wave received by the external device to the sensor 200.

At least a part of the stretchable conductive pattern 20 is formed in a long strip shape, and is wound in a spiral shape in a plan view. More specifically, in the case of the present embodiment, the entire stretchable conductive pattern 20 is formed, for example, in a long strip shape, and is wound in a spiral shape in a plan view. Each of one end 21 and the other end 22 of the stretchable conductive pattern 20 have a relatively wider width than the other parts and is formed in a circular shape in a plan view. Further, the one end 21 and the other end 22 are arranged side by side in the radial direction of the stretchable conductive pattern 20.

Further, in a plan view, a center of the stretchable conductive pattern 20 (center of the spiral shape) substantially coincides with a center of the circular portion 15 of the stretchable base material 10.

Note that a planar shape and positional relationship of the stretchable conductive pattern 20 are not limited to the above example, and can be appropriately set according to dimensions or the application of the stretchable circuit board 100.

Here, as illustrated in FIGS. 2 and 3, the stretchable circuit board 100 further includes, for example, the draw-out wiring 40 formed on one main surface 30a of the reinforcing base 30. One end 41 of the draw-out wiring 40 is electrically and mechanically connected to the stretchable conductive pattern 20.

As illustrated in FIG. 1, the draw-out wiring 40 includes, for example, a first draw-out wiring 46 connected to the one end 21 of the stretchable conductive pattern 20 and a second draw-out wiring 47 connected to the other end 22 of the stretchable conductive pattern 20.

Each of the first draw-out wiring 46 and the second draw-out wiring 47 includes a relatively wide one end 41 and a relatively wide other end 42, and a relatively narrow width intermediate portion 43. The intermediate portion 43 extends over the one end 41 and the other end 42.

Each of the one end 41 and the other end 42 is formed in a circular shape in a plan view. An outer diameter of the one end 41 is smaller than that of the other end 42.

The one end 41 of the first draw-out wiring 46 and the one end 41 of the second draw-out wiring 47 are configured to have the same outer diameter. The other end 42 of the first draw-out wiring 46 and the other end 42 of the second draw-out wiring 47 are configured to have the same outer diameter. On the other hand, the intermediate portion 43 of the first draw-out wiring 46 is formed to be longer than the intermediate portion 43 of the second draw-out wiring 47.

Further, the one end 41 of the first draw-out wiring 46 and the one end 41 of the second draw-out wiring 47 are arranged side by side in the radial direction of the stretchable conductive pattern 20. The other end 42 of the first draw-out wiring 46 and the other end 42 of the second draw-out wiring 47 are arranged side by side in a direction perpendicular to an arrangement direction of the one end 41.

Note that a planar shape and positional relationship of the draw-out wiring 40 (first draw-out wiring 46 and second draw-out wiring 47) are not limited to the above example, and can be appropriately set according to the dimensions or the application of the stretchable circuit board 100.

As illustrated in FIGS. 2 and 3, the stretchable cover layer 50 is interposed between the stretchable conductive pattern 20 and the draw-out wiring 40.

More specifically, the stretchable cover layer 50 has, for example, insulating properties and stretchability, and is interposed between the reinforcing base 30 and the stretchable base material 10.

An upper surface of the stretchable cover layer 50 is in direct contact with a lower surface (the one main surface 10a) of the stretchable base material 10 substantially entirely except for a region where the stretchable conductive pattern 20 is formed. Similarly, the lower surface of the stretchable cover layer 50 is in direct contact with an upper surface (the one main surface 30a) of the reinforcing base 30 substantially entirely except for a region where the draw-out wiring 40 is formed.

Further, the stretchable conductive pattern 20 is, for example, in a state of sinking into the stretchable cover layer 50 from the upper surface side of the stretchable cover layer 50. The draw-out wiring 40 is, for example, in a state of sinking into the stretchable cover layer 50 from the lower surface side of the stretchable cover layer 50.

A planar shape of the stretchable cover layer 50 is formed, for example, in a substantially circular shape in which a part of the stretchable cover layer 50 locally projects outward in the radial direction. A portion formed in a circular shape of the stretchable cover layer 50 covers the entire circular portion 15 of the stretchable base material 10 in a plan view. The remaining portion of the stretchable cover layer 50 (the portion locally projecting outward in the radial direction) covers a part of the rectangular portion 17 of the stretchable base material 10 in a plan view.

A material constituting the stretchable cover layer 50 is not particularly limited, but is, for example, an elastomer material similar to the stretchable base material 10.

However, the stretchable cover layer 50 is only required to be made of a material having at least insulating properties and stretchability, and may be made of a material different from the stretchable base material 10.

The thickness dimension of the stretchable cover layer 50 is not particularly limited. However, from the viewpoint of not easily hindering the stretching and contracting movement of the skin surface 300, the thickness dimension of the stretchable cover layer 50 is preferably, for example, 50 µm or less, and more preferably 5 µm or less.

Here, as illustrated in FIGS. 2 and 3, in the case of the present embodiment, the one end 41 of the draw-out wiring 40 and the stretchable conductive pattern 20 are connected to each other through an opening hole 55 formed in the stretchable cover layer 50.

More specifically, the opening hole 55 includes a first opening hole 56 formed at a position corresponding to the one end 41 of the first draw-out wiring 46 in the stretchable cover layer 50, and a second opening hole 57 formed at a position corresponding to the one end 41 of the second draw-out wiring 47 in the stretchable cover layer 50.

The one end 41 of the first draw-out wiring 46 is electrically and mechanically connected to the one end 21 of the stretchable conductive pattern 20 through the first opening hole 56. The one end 41 of the second draw-out wiring 47 is electrically and mechanically connected to the other end 22 of the stretchable conductive pattern 20 through the second opening hole 57.

The first opening hole 56 and the second opening hole 57 are configured to have the same shape and the same dimensions as each other. Further, an outer diameter of each of the first opening hole 56 and the second opening hole 57 is smaller than the outer diameter of the one end 41 of the first draw-out wiring 46.

Note that in FIG. 3, thicknesses of the one end 41 of the draw-out wiring 40, and the one end 21 and the other end 22 of the stretchable conductive pattern 20 are illustrated enlarged for convenience. The draw-out wiring 40 and the stretchable conductive pattern 20 do not necessarily have to be formed in this way.

In the case of the present embodiment, each of the stretchable conductive pattern 20 and the draw-out wiring 40 is a coating film configured to include, for example, a conductive filler and a binder containing a thermoplastic resin.

Therefore, when manufacturing the stretchable circuit board 100, the stretchable conductive pattern 20 and the draw-out wiring 40 are heated and pressurized, so that the one end 41 of the draw-out wiring 40 and the stretchable conductive pattern 20 can be fused to each other through the opening hole 55.

That is, the stretchable conductive pattern 20 and the draw-out wiring 40 can be electrically and mechanically connected to each other with a simpler structure without using a conductive adhesive or the like. Therefore, manufacturability of the stretchable circuit board 100 can be improved.

Moreover, the stretchable conductive pattern 20 contains the binder containing the thermoplastic resin. Therefore, the stretchable conductive pattern 20 can satisfactorily follow the stretching and contracting of the stretchable base material 10.

The conductive filler includes, for example, silver, gold, platinum, carbon, copper, aluminum, cobalt, nickel, or an alloy thereof.

Examples of the thermoplastic resin include thermoplastic elastomer materials such as urethane resin, acrylic resin, and silicone rubber. Further, as the thermoplastic resin, it is desirable to select one with a low Young's modulus so that an elastic modulus of the stretchable conductive pattern 20 in a coated film state is equal to or smaller than that of the stretchable base material 10. As the elastomer material, one kind of elastomer material may be used, or a plurality of kinds of elastomer materials may be mixed and used.

Further, a method for forming each of the stretchable conductive pattern 20 and the draw-out wiring 40 is not particularly limited, but for example, a printing method can be used. The printing method is not particularly limited, but includes, for example, a screen printing method, an inkjet printing method, a gravure printing method, an offset printing method, and the like.

The thickness of the stretchable conductive pattern 20 is not particularly limited, but is preferably 10 μm or more, and more preferably about 20 μm.

Similarly, the thickness of the draw-out wiring 40 is not particularly limited, but is preferably 10 μm or more, and more preferably about 20 μm.

Further, in the case of the present embodiment, it is preferred that the reinforcing base 30 surrounds the periphery of the formation region of the stretchable conductive pattern 20 in the stretchable base material 10 over a range of 240 degrees or more. More preferably, the reinforcing base 30 surrounds the periphery the formation region of the stretchable conductive pattern 20 in the stretchable base material 10 over a range of 270 degrees or more. More specifically, in the case of the present embodiment, the reinforcing base 30 preferably extends over a range of 240 degrees or more along the peripheral edge portion of the circular portion 15 of the stretchable base material 10.

Thus, the stretchable base material 10 can be better reinforced by the reinforcing base 30.

In the case of the present embodiment, the reinforcing base 30 surrounds the periphery the formation region of the stretchable conductive pattern 20 in the stretchable base material 10 over the entire circumference. That is, the reinforcing base 30 extends in a circumferential shape along the peripheral edge portion of the circular portion 15 of the stretchable base material 10.

Thus, the stretchable base material 10 can be better reinforced by the reinforcing base 30. Therefore, in particular, in a stage before the stretchable circuit board 100 is attached to, for example, the skin surface 300 of the living body or another flexible object, it is possible to ensure sufficient shape retention of the stretchable circuit board 100 and the stretchable base material 10.

However, the reinforcing base 30 is only required to be formed to surround at least a part of the formation region of the stretchable conductive pattern 20 in the stretchable base material 10. For example, the surrounding portion 31 may be formed intermittently along the peripheral edge portion of the circular portion 15. Alternatively, the surrounding portion 31 may be locally formed on a part of the peripheral edge portion of the circular portion 15. Further, a planar shape of the surrounding portion 31 is not particularly limited, and may be a shape other than an annular shape, for example, an elliptical ring shape, a rectangular ring shape, and a polygonal ring shape.

Figure 4:
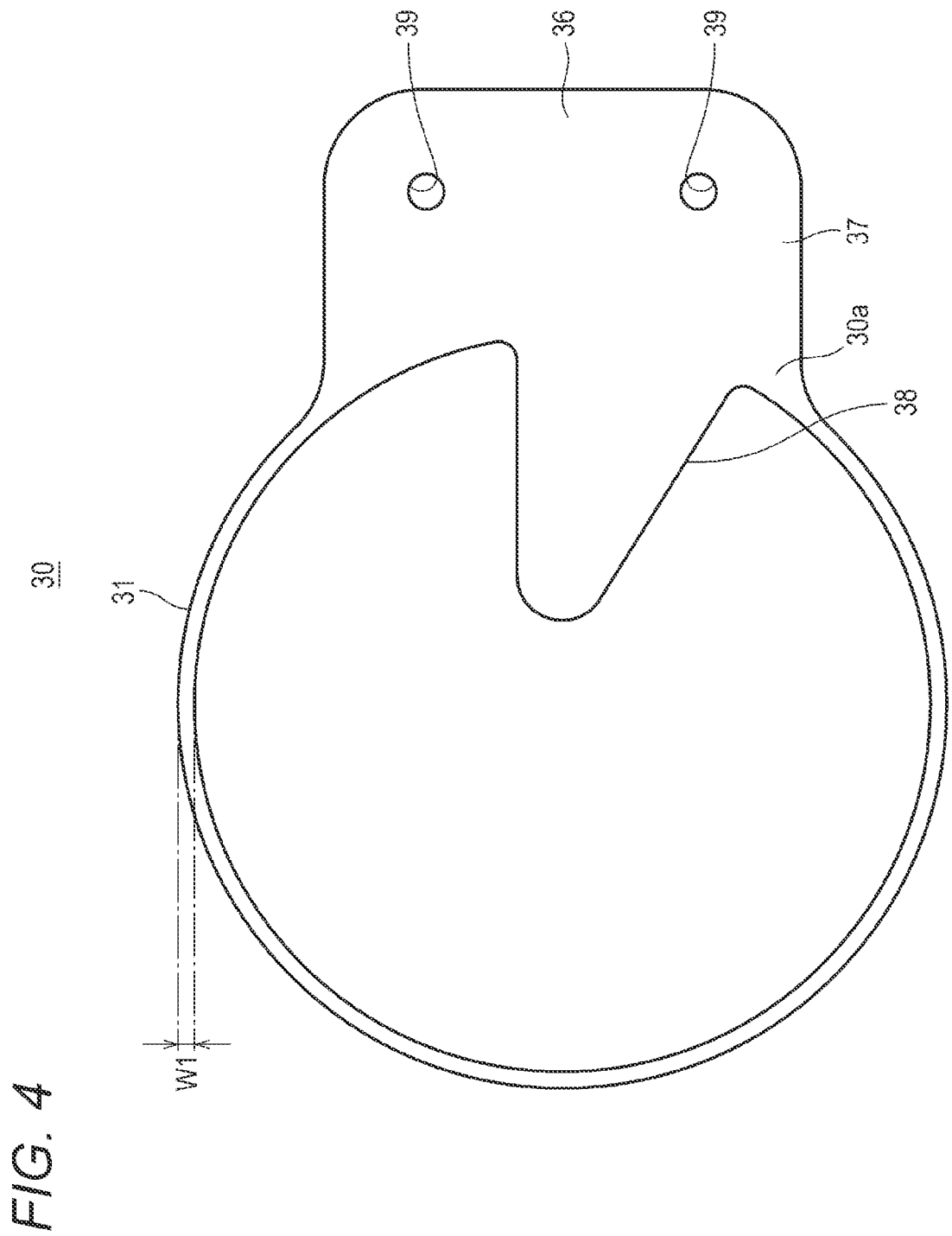
FIG. 4 is a schematic plan view illustrating a reinforcing base in the first embodiment.

More specifically, as illustrated in FIG. 4, the reinforcing base 30 includes, for example, the surrounding portion 31 surrounding at least a part of the formation region of the stretchable conductive pattern 20 in the stretchable base material 10, and a draw-out wiring forming portion 36 in which the draw-out wiring 40 is formed.

As illustrated in FIG. 5, the surrounding portion 31 is a portion having a relatively low rigidity in the reinforcing base 30. The surrounding portion 31 deforms following the stretching and contracting of the stretchable base material 10. On the other hand, the draw-out wiring forming portion 36 is a portion having relatively high rigidity in the reinforcing base 30. The draw-out wiring forming portion 36 does not substantially follow the stretching and contracting of the stretchable base material 10.

The surrounding portion 31 is formed in a substantially annular shape in a plan view, and extends in a circumferential shape along the peripheral edge portion of the circular portion 15. That is, the surrounding portion 31 is formed in a circumferentially long strip shape that surrounds at least a part of the formation region of the stretchable conductive pattern 20 in the stretchable base material 10. Further, an outer diameter dimension of the surrounding portion 31 is set to be substantially the same as that of the circular portion 15. In the case of the present embodiment, the entire stretchable conductive pattern 20 is disposed inside an inner peripheral edge of the surrounding portion 31 in a plan view, and the center of the stretchable conductive pattern 20 and a center of the surrounding portion 31 coincide with each other. More specifically, an outer peripheral edge of the stretchable conductive pattern 20 and the inner peripheral edge of the surrounding portion 31 are separated from each other in the radial directions. A distance (distance D1 illustrated in FIG. 1) between the outer peripheral edge of the stretchable conductive pattern 20 and the inner peripheral edge of the surrounding portion 31 is not particularly limited, but is preferably, for example, 0.5 mm or more.

The draw-out wiring forming portion 36 is connected to, for example, a part of the surrounding portion 31 in the circumferential direction. More specifically, the draw-out wiring forming portion 36 includes a main portion 37 projecting outward in the radial direction of the surrounding portion 31 and a projecting portion 38 projecting inward in the radial direction of the surrounding portion 31 with reference to the surrounding portion 31.

For example, the main portion 37 is formed in the same planar shape as the rectangular portion 17 of the stretchable base material 10, and overlaps the rectangular portion 17 in a plan view.

A planar shape of the projecting portion 38 is not particularly limited. In FIGS. 1, 4 and the like, for example, the projecting portion 38 is formed in a substantially delta shape in a plan view, and a tip of the projecting portion 38 (tip in the projecting direction) is disposed at the center of the surrounding portion 31. However, the projecting portion 38 may be formed, for example, in an elliptical shape in a plan view.

The one end 41 of the draw-out wiring 40 (first draw-out wiring 46 and second draw-out wiring 47) is formed in the projecting portion 38. The other end 42 of the draw-out wiring 40 is formed in the main portion 37. Further, the intermediate portion 43 of the draw-out wiring 40 extends over the projecting portion 38 and the main portion 37.

Here, a width dimension of the surrounding portion 31 (width dimension W1 illustrated in FIGS. 1 and 4) is preferably 2 mm or less.

By setting the width dimension of the surrounding portion 31 in this way, the rigidity of the surrounding portion 31 can be locally reduced. Therefore, the surrounding portion 31 can be satisfactorily deformed by following the stretching and contracting of the stretchable base material 10.

More specifically, the width dimension W1 of the surrounding portion 31 is preferably 0.1 mm or more and 0.5 mm or less. When the width dimension W1 of the surrounding portion 31 is 0.5 mm or less, the handleability and the wearing feeling of the stretchable circuit board 100 can be improved.

The reinforcing base 30 is a member having flexibility, and has a Young's modulus larger than that of the stretchable base material 10. The material of the reinforcing base 30 is not particularly limited, but a synthetic resin having low sliding property, corrosion resistance and high strength can be used, such as polyethylene terephthalate (PET), polyethylene naphthalate (PEN), polyimide (PI), polyphenylene sulfide (PPS) or fluororesin. Alternatively, as the reinforcing base 30, a paper material having appropriate durability such as cellulose nanofiber paper may be used.

In the case of the present embodiment, the entire reinforcing base 30 is integrally molded. Not limited to this example, for example, the surrounding portion 31 and the draw-out wiring forming portion 36 may be formed as separate bodies from each other.

The thickness dimension of the reinforcing base 30 is not particularly limited, but is preferably 10 μm or more and 200 μm or less, and more preferably 50 μm or more and 100 μm or less.

Further, in the case of the present embodiment, an elastomer layer (not illustrated) is formed on the main surface of the reinforcing base 30. Therefore, the reinforcing base 30 and the stretchable cover layer 50 can be fused to each other by performing heating and pressurization during the manufacture of the stretchable circuit board 100, and bond strength (adhesion strength) between the elastomer layer and the stretchable cover layer 50 can be made extremely high. Further, at this time, the stretchable base material 10 and the stretchable cover layer 50 can also be fused to each other. As a heating method, a laminating method using a heating roll, or a heating press can be employed. The heating press may be performed in air or in vacuum.

Further, in the case of the present embodiment, the draw-out wiring 40 is formed on the one main surface 30a of the reinforcing base 30 via the elastomer layer.

With such a configuration, integrity of the draw-out wiring 40 with respect to the reinforcing base 30 can be improved. That is, in this configuration, the draw-out wiring 40 is not formed directly on the reinforcing base 30, but is formed on the reinforcing base 30 via the elastomer layer. Therefore, the draw-out wiring 40 can be formed with good adhesion on the elastomer layer which is a base layer.

Further, in the case of the present embodiment, the adhesive layer 61 is directly laminated on a surface 30b of the reinforcing base 30 opposite to the stretchable base material 10. Note that the adhesive layer 61 may be indirectly laminated on the surface 30b of the reinforcing base 30 opposite to the stretchable base material 10.

In the case of the present embodiment, the adhesive layer 61 is formed by being applied with an adhesive material. More specifically, the adhesive layer 61 is a single film formed, for example, by applying the adhesive material having a desired thickness on an upper surface of the first release film 71, and curing the applied adhesive material by heat processing. Therefore, the adhesive layer 61 can follow the stretching and contracting of the stretchable base material 10 better than a case where the adhesive layer 61 contains a core material such as non-woven fabric or paper.

Note that when manufacturing the stretchable circuit board 100, in a stage before being laminated on the reinforcing base 30, the adhesive layer 61 also has a release film (not illustrated) on a surface opposite to the first release film 71 side. Then, by peeling the release film from the adhesive layer 61, the adhesive layer 61 can be attached to the reinforcing base 30.

The adhesive material is not particularly limited, but for example, the acrylic resin or the like can be used. Note that when the stretchable circuit board 100 is attached to the skin surface 300 as in the present embodiment, the adhesive material is preferably a material having compatibility with the living body.

The first release film 71 is laminated on a lower surface of the adhesive layer 61 so as to be easily peelable from the adhesive layer 61. Similarly, the second release film 76 is laminated on an upper surface of the stretchable base material 10 so as to be easily peelable from the stretchable base material 10.

When using the stretchable circuit board 100, for example, by first peeling the first release film 71 from the adhesive layer 61, the stretchable circuit board 100 is brought into a state where the adhesive layer 61 is exposed on the lower surface side of the stretchable circuit board 100. Thus, the stretchable circuit board 100 can be attached to the skin surface 300 via the adhesive layer 61. Therefore, the stretchable circuit board 100 is attached to the skin surface 300 in a posture in which the one main surface 10a of the stretchable base material 10 faces downward and the opposite surface thereof (the other main surface 10b) faces upward. Subsequently, by peeling the second release film 76 from the stretchable base material 10, the stretchable circuit board 100 is brought into a state where the stretchable base material 10 is exposed on the upper surface side of the stretchable circuit board 100. Then, the sensor 200 is placed on the upper surface (the other main surface 10b) of the stretchable base material 10. In this way, before the second release film 76 is peeled off, the stretchable circuit board 100 is attached to the skin surface 300. This makes it possible to easily fit the stretchable circuit board 100 to the skin surface 300. However, in the case of the present embodiment, as described above, the stretchable base material 10 is reinforced by the reinforcing base 30. Therefore, even when the second release film 76 is in the state of being peeled from the stretchable circuit board 100, the stretchable base material 10 can be sufficiently maintained in an unfolded state in the surface direction.

Materials of the first release film 71 and the second release film 76 are not particularly limited, but may be polyethylene terephthalate (PET), paper, or the like. The first release film 71 and the second release film 76 may be made of the same material, or may be made of different materials from each other.

Further, in the case of the present embodiment, an external connection terminal 80 is provided at the other end 42 of the draw-out wiring 40. The stretchable circuit board 100 is electrically and mechanically connected to the sensor 200 via the external connection terminal 80. Therefore, the sensor 200 is placed on the draw-out wiring forming portion 36 via the stretchable base material 10.

The stretchable circuit board 100 supplies the electric power energized via the stretchable conductive pattern 20 (coil wiring) to the draw-out wiring 40, and further supplies the electric power to the sensor 200 via the external connection terminal 80.

The external connection terminal 80 includes, for example, a first member 81 placed on one surfaces 30a and 40a of the reinforcing base 30 and the draw-out wiring 40, and a second member 86 fitted into the first member 81 via the reinforcing base 30 from a side of the other surfaces 30b and 40b of the reinforcing base 30 and the draw-out wiring 40.

More specifically, as illustrated in FIGS. 1 and 2, at a position corresponding to the other end 42 of the draw-out wiring 40 in the draw-out wiring forming portion 36, an insertion hole 39 is formed to vertically penetrate the draw-out wiring forming portion 36 and the other end 42. The first member 81 and the second member 86 are in a state of vertically sandwiching a peripheral edge portion of the insertion hole 39 in the draw-out wiring forming portion 36 and the other end 42. That is, the first member 81 and the second member 86, in this state, are fixed to each other through the insertion hole 39.

Thus, the external connection terminal 80 is electrically and mechanically connected to the other end 42 of the draw-out wiring 40.

More specifically, as illustrated in FIGS. 2 and 3, the first member 81 includes a protuberance 83 in which the second member 86 is fitted, and a first fixing plate 82 disposed on the one surface 40a side of the draw-out wiring 40. The protuberance 83 is formed in a cylindrical shape that stands upright. An upper end side of the protuberance 83 is closed, while a lower end side of the protuberance 83 is open downward. The first fixing plate 82 is formed in an inner flange shape having an annular planar shape. The first fixing plate 82 projects outward in a radial direction of the protuberance 83 from the lower end of the protuberance 83.

The second member 86 includes a fitting protuberance 88 fitted into the protuberance 83, and a second fixing plate 87 disposed on the other surface 30b side of the draw-out wiring forming portion 36.

The fitting protuberance 88 is formed in a cylindrical shape with a vertical direction as an axial direction. The second fixing plate 87 is formed in an inner flange shape having an annular planar shape. The second fixing plate 87 projects outward in a radial direction of the fitting protuberance 88 from a lower end of the fitting protuberance 88.

Further, an inner diameter of the insertion hole 39 is larger than the outer diameter of the protuberance 83, while being smaller than an outer diameter of the second fixing plate 87. Therefore, the protuberance 83 is inserted into the insertion hole 39. On the other hand, the second fixing plate 87 is locked to the other surface 30b of the reinforcing base 30 outside the insertion hole 39.

When the first member 81 and the second member 86 are fixed to each other, the first fixing plate 82 of the first member 81 is disposed on the peripheral edge portion of the insertion hole 39 at the other end 42. Further, the fitting protuberance 88 of the second member 86 is inserted into the protuberance 83 from an opening on the lower end side of the protuberance 83 through the insertion hole 39. In such a state, by plastically deforming the first member 81 by applying pressure from above, the fitting protuberance 88 is plastically deformed together with the protuberance 83, inside the protuberance 83. Thus, the first member 81 and the second fixing plate 87 are fixed to each other in a state where the first fixing plate 82 of the first member 81 and the second fixing plate 87 of the second member 86 sandwich the reinforcing base 30 and the draw-out wiring 40 from above and below.

In the case of the present embodiment, the external connection terminal 80 is, for example, a male hook formed by fitting the second member 86 into the first member 81. Further, the sensor 200 includes a female hook 210 corresponding to the male hook. By fitting a projection (the protuberance 83) of the male hook into a recess of the female hook 210, the sensor 200 is electrically and mechanically connected to the stretchable circuit board 100. However, the external connection terminal 80 may be configured as the female hook, and the sensor 200 may include the male hook.

Note that in FIG. 6, a shape of the female hook 210 is schematically illustrated.

Further, as illustrated in FIG. 1, the external connection terminal 80 includes, for example, a first external connection terminal 80a provided at the other end 42 of the first draw-out wiring 46, and a second external connection terminal 80b provided at the other end 42 of the second draw-out wiring 47.

The first external connection terminal 80a and the second external connection terminal 80b have the same configuration, and both include the first member 81 and second member 86 described above. Then, in the draw-out wiring forming portion 36, the insertion holes 39 are respectively formed in a central portion of the other end portion 42 of the first draw-out wiring 46 and a central portion of the other end portion 42 of the second draw-out wiring 47. The first member 81 and the second member 86 of the first external connection terminal 80a are fixed to the draw-out wiring forming portion 36 and the first draw-out wiring 46 through the insertion hole 39 formed at the other end 42 of the first draw-out wiring 46. Similarly, the first member 81 and the second member 86 of the second external connection terminal 80b are fixed to the draw-out wiring forming portion 36 and the second draw-out wiring 47 through the insertion hole 39 formed at the other end 42 of the second draw-out wiring 47.

Further, as illustrated in FIGS. 2 and 3, openings 78 and 19 are respectively formed at positions corresponding to the insertion hole 39 in the second release film 76 and the stretchable base material 10. When the sensor 200 is connected to the stretchable circuit board 100, the protuberance 83 of the first member 81 is fitted into the recess of the female hook 210 of the sensor 200 through the openings 78 and 19.

Further, the reinforcing base 30 does not necessarily have to have the insertion hole 39 formed therein. In this case, for example, the second member 86 is only required to fix the first member 81 so that at least the first member 81 can be maintained in contact with the draw-out wiring 40. Therefore, the second member 86 may or may not be in contact with the draw-out wiring 40.

The first member 81 and the second member 86 are made of, for example, a conductive material such as stainless steel/SUS or brass. Further, when the stretchable circuit board 100 is used attached to the living body as in the present embodiment, surfaces of the first member 81 and the second member 86 are preferably covered with stainless steel, gold plating, or the like.

Outer diameters of the first member 81 and the second member 86 are not particularly limited, but are preferably 5 mm or more and 10 mm or less.

Second Embodiment

Figure 7:
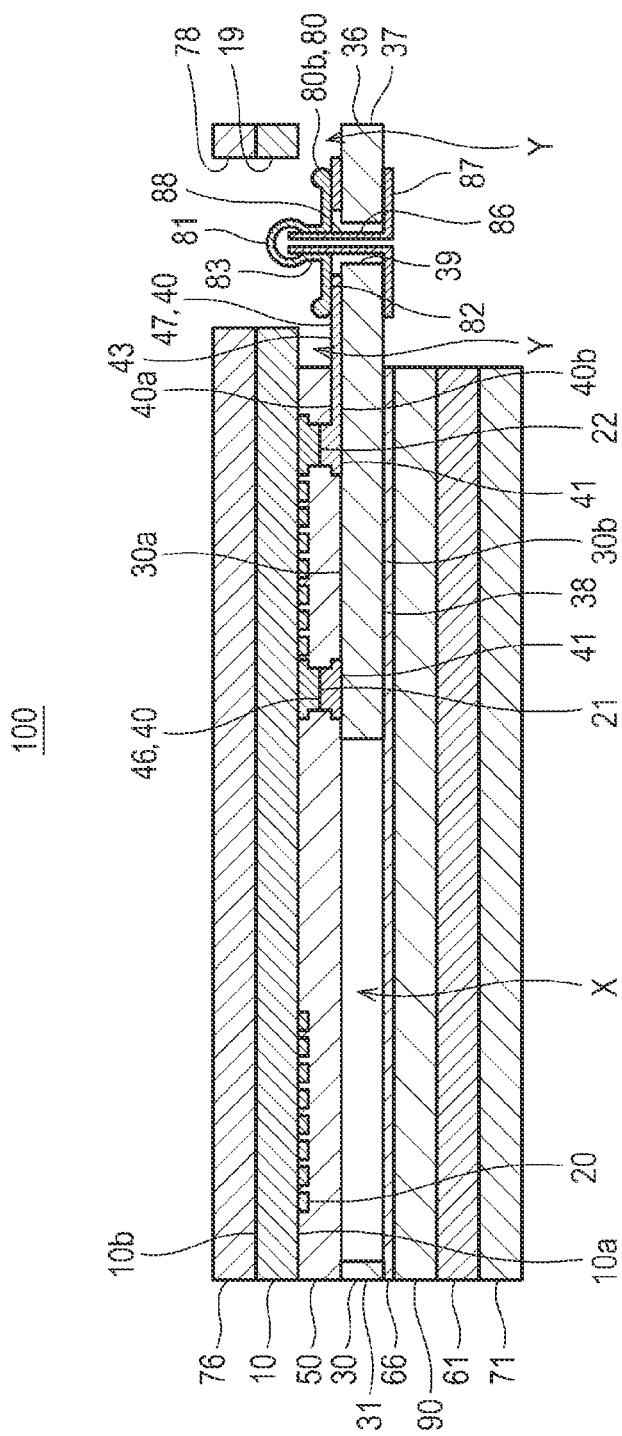
FIG. 7 is a schematic end view illustrating the stretchable circuit board according to a second embodiment.

Next, the second embodiment will be described with reference to FIG. 7. Note that FIG. 7 illustrates the cut end surface of the stretchable circuit board 100 along a line corresponding to the line X-X of FIG. 1. In addition, in FIG. 7, in the drawing description, there is the gap X between the stretchable cover layer 50 and a second adhesive layer 66 in the inner region of the surrounding portion 31. However, in reality, the stretchable cover layer 50 and the second adhesive layer 66 are laminated and in close contact to each other in the inner region. Therefore, the gap X disappears. Similarly, in FIG. 7, in the drawing description, there is the gap Y between the stretchable base material 10 and the reinforcing base 30 and/or the draw-out wiring 40 in the peripheral edge portion of the opening 19 to be described below. However, in reality, the stretchable base material 10 and the reinforcing base 30 and/or the drawer wiring 40 are laminated and in close contact to each other in the peripheral edge portion. Therefore, the gap Y disappears.

The stretchable circuit board 100 according to the second embodiment is different from the stretchable circuit board 100 according to the first embodiment in the following points, and is otherwise configured in the same manner as the stretchable circuit board 100 according to the first embodiment.

The stretchable circuit board 100 according to the present embodiment includes a magnetic shield layer 90 (see FIG. 7). The magnetic shield layer 9X) is disposed to cover at least a part of the formation region of the stretchable conductive pattern 20 in the stretchable base material 10 in a plan view, and is indirectly laminated on the stretchable base material 10. In this respect, the stretchable circuit board 100 according to the present embodiment is different from the stretchable circuit board 100 according to the first embodiment.

In this configuration, the magnetic shield layer 90 functions as a magnetic yoke. Therefore, a magnetic field generated from the external device (power coil) efficiently acts on the stretchable conductive pattern 20. Therefore, a power transmission efficiency and a communication (transmission/reception) distance of the stretchable conductive pattern 20 can be improved.

Note that the magnetic shield layer 90 may be, for example, disposed to cover the formation region of the stretchable conductive pattern 20 in the stretchable base material 10 in a plan view, and may be directly laminated on the stretchable base material 10.

In the case of the present embodiment, the magnetic shield layer 90 is interposed between the adhesive layer 61 and the reinforcing base 30. More specifically, also in the case of the present embodiment, the stretchable circuit board 100 is attached to the skin surface 300 via the adhesive layer 61. Then, the stretchable conductive pattern 20 is placed on a side of the reinforcing base 30 opposite to the adhesive layer 61.

Therefore, the magnetic shield layer 90 is disposed on the skin surface 300 side with the stretchable conductive pattern 20 as a reference, and the magnetic shield layer 90 functions as the magnetic yoke. Therefore, the magnetic field generated from the external device (power coil) acts on the stretchable conductive pattern 20 more efficiently.

The magnetic shield layer 90 is, for example, a sheet material configured to contain magnetic powder and an elastomer resin. The magnetic powder is not particularly limited, but preferably has a magnetic permeability of 10 [μH/m] or more, more preferably 20 [μH/m] or more, and further preferably 50 [μH/m] or more. Examples of such magnetic powder include permalloy (Ni—Fe-based alloy) and Sendust (Fe—Si—Al-based alloy).

As such a magnetic shield layer 90, BUSTERAID (registered trademark) can be used as an example.

The thickness dimension of the magnetic shield layer 90 is not particularly limited. However, from the viewpoint of sufficiently ensuring the stretchability of the stretchable circuit board 100, the thickness dimension of the magnetic shield layer 90 is, for example, preferably 0.25 mm or more and 0.5 mm or less.

In the case of the present embodiment, the stretchable circuit board 100 further includes the second adhesive layer 66 that directly joins the magnetic shield layer 90 and the stretchable base material 10.

The second adhesive layer 66 and the magnetic shield layer 90 have, for example, the same outer shape as the adhesive layer 61. A lower surface of the second adhesive layer 66 is in direct contact with a substantially entire upper surface of the magnetic shield layer 90. A lower surface of the magnetic shield layer 90 is in direct contact with a substantially entire upper surface of the adhesive layer 61.

Note that the second adhesive layer 66 may be configured to indirectly join the magnetic shield layer 90 and the stretchable base material 10.

Here, the second adhesive layer 66 is, for example, a single film made of an adhesive material, similarly to the adhesive layer 61. That is, in the case of the present embodiment, each of the adhesive layer 61 and the second adhesive layer 66 is a single film formed by being applied with the adhesive material.

Thus, the adhesive layer 61 and the second adhesive layer 66 can be satisfactorily deformed as the stretchable base material 10 stretches and contracts.

The adhesive layer 61 and the second adhesive layer 66 may be made of the same adhesive material, or may be made of different adhesive materials from each other.

Further, in the case of the present embodiment, as in the first embodiment, the stretchable conductive pattern 20 may be, for example, either the coil wiring or the antenna pattern. Alternatively, the stretchable conductive pattern 20 may be the antenna pattern as well as the coil wiring. The function (configuration) of the stretchable conductive pattern 20 can be appropriately set according to the application of the stretchable circuit board 100.

The embodiments have been described above with reference to the drawings. These are examples of techniques of the present disclosure. As another example of the techniques of the present disclosure, various configurations other than the above can be employed.

For example, in the above example, the reinforcing base 30 is indirectly laminated on the stretchable base material 10. Not limited to this example, the reinforcing base 30 may be directly laminated on the stretchable base material 10. Alternatively, for example, a part of the reinforcing base 30 may be directly laminated on the stretchable base material 10, while the other part of the reinforcing base 30 may be indirectly laminated on the stretchable base material 10.

Further, in the second embodiment, an example in which the stretchable circuit board 100 includes the reinforcing base 30 has been described. In this regard, for example, the stretchable circuit board 100 does not have to include the reinforcing base 30. That is, the stretchable circuit board 100 provided in one aspect of the present disclosure includes: the stretchable base material 10; the stretchable conductive pattern 20 formed on at least the one main surface 10a of the stretchable base material 10 and having stretchability; and the magnetic shield layer 90 disposed to cover at least a part of the formation region of the stretchable conductive pattern 20 in the stretchable base material 10 in a plan view, and is indirectly or directly laminated on the stretchable base material 10. According to this aspect, the power transmission efficiency and the communication (transmission/reception) distance of the stretchable conductive pattern 20 can be improved.

The present embodiment includes the following technical ideas.

(1) A stretchable circuit board includes:
a stretchable base material:
a stretchable conductive pattern formed on at least one main surface of the stretchable base material and having stretchability; and
a reinforcing base having higher rigidity than the stretchable base material, wherein
the reinforcing base reinforces the stretchable base material by being directly or indirectly laminated on the stretchable base material so as to surround at least a part of a formation region of the stretchable conductive pattern in the stretchable base material in a plan view.

(2) The stretchable circuit board according to (1), further includes
a draw-out wiring formed on one main surface of the reinforcing base, wherein
one end of the draw-out wiring and the stretchable conductive pattern are connected to each other, and
an external connection terminal is provided at the other end of the draw-out wiring.

(3) The stretchable circuit board according to (2), further includes
a stretchable cover layer having insulating properties and stretchability, and interposed between the reinforcing base and the stretchable base material, wherein
the one end of the draw-out wiring and the stretchable conductive pattern are connected to each other through an opening hole formed in the stretchable cover layer.

(4) The stretchable circuit board according to (2) or (3), wherein the external connection terminal includes: a first member disposed on one surface side of the reinforcing base and the draw-out wiring; and a second member fitted into the first member via the reinforcing base, from the other surface side of the reinforcing base and the draw-out wiring.

(5) The stretchable circuit board according to any one of the above (2) to (4), in which
the reinforcing base includes:
a surrounding portion surrounding at least the part of the formation region of the stretchable conductive pattern in the stretchable base material; and
a draw-out wiring forming portion in which the draw-out wiring is formed,
the surrounding portion is formed in a circumferentially long strip shape that surrounds the formation region of the stretchable conductive pattern in the stretchable base material, and a width dimension of the surrounding portion is 2 mm or less.

(6) The stretchable circuit board according to any one of (1) to (5), wherein at least a part of the stretchable conductive pattern is a coil wiring formed in a spiral shape.

(7) The stretchable circuit board according to any of one (1) to (6), wherein the stretchable conductive pattern is an antenna pattern that functions as an antenna.

(8) The stretchable circuit board according to any of one (1) to (7), further includes a magnetic shield layer disposed to cover at least the part of the formation region of the stretchable conductive pattern in the stretchable base material in a plan view, and directly or indirectly laminated on the stretchable base material.

(9) The stretchable circuit board according to any one of (1) to (8), further includes an adhesive layer that is directly or indirectly laminated on a surface of the reinforcing base opposite to the stretchable base material side.

(10) The stretchable circuit board according to (8), further includes an adhesive layer that is directly or indirectly laminated on a surface of the reinforcing base opposite to the stretchable base material side, wherein
the magnetic shield layer is interposed between the adhesive layer and the reinforcing base.

(11) The stretchable circuit board according to any one of (1) to (10), wherein the reinforcing base surrounds the formation region of the stretchable conductive pattern in the stretchable base material over a range of 240 degrees or more.

(12) The stretchable circuit board according to (11), wherein the reinforcing base surrounds the formation region of the stretchable conductive pattern in the stretchable base material over an entire circumference of the formation region.

<1>
A stretchable circuit board including:
a stretchable base material;
a stretchable conductive pattern formed on at least one main surface of the stretchable base material and having stretchability; and
a magnetic shield layer disposed to cover at least a part of a formation region of the stretchable conductive pattern and indirectly or directly laminated on the stretchable base material, in a plan view.

<2>
The stretchable circuit board according to the above <1>, further including an adhesive layer directly or indirectly laminated on the stretchable base material, in which
the magnetic shield layer is interposed between the adhesive layer and the stretchable base material, the stretchable conductive pattern.

<3>
The stretchable circuit board according to the above <1> or <2>, in which at least a part of the stretchable conductive pattern is a coil wiring formed in a spiral shape.

<4>
The stretchable circuit board according to any one of the above <1> to <3>, in which the stretchable conductive pattern is an antenna pattern that functions as an antenna.

<5>
The stretchable circuit board according to any one of the above <1> to <4>, further includes a second adhesive layer that directly or indirectly joins the magnetic shield layer and the stretchable base material.

<6>
The stretchable circuit board according to the above <5>, in which the adhesive layer and the second adhesive layer are layers formed by being applied with an adhesive material.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A stretchable circuit board comprising:
   a stretchable base material;
   a stretchable conductive pattern formed on at least one main surface of the stretchable base material and having stretchability; and
   a reinforcing base having higher rigidity than the stretchable base material, wherein
   the reinforcing base reinforces the stretchable base material by being directly or indirectly laminated on the stretchable base material so as to surround a formation region of the stretchable conductive pattern in the stretchable base material in a plan view.

2. The stretchable circuit board according to claim 1, further comprising
   a draw-out wiring formed on one main surface of the reinforcing base, wherein
   one end of the draw-out wiring and the stretchable conductive pattern are connected to each other, and
   an external connection terminal is provided at the other end of the draw-out wiring.

3. The stretchable circuit board according to claim 2, further comprising
   a stretchable cover layer having insulating properties and stretchability, and interposed between the reinforcing base and the stretchable base material, wherein
   the one end of the draw-out wiring and the stretchable conductive pattern are connected to each other through an opening hole formed in the stretchable cover layer.

4. The stretchable circuit board according to claim 2, wherein the external connection terminal includes: a first member disposed on one surface side of the reinforcing base and the draw-out wiring; and a second member fitted into the first member via the reinforcing base, from the other surface side of the reinforcing base and the draw-out wiring.

5. The stretchable circuit board according to claim 2, wherein
   the reinforcing base includes:
   a surrounding portion surrounding the formation region of the stretchable conductive pattern in the stretchable base material; and
   a draw-out wiring forming portion in which the draw-out wiring is formed,
   the surrounding portion is formed in a circumferentially long strip shape that surrounds the formation region of the stretchable conductive pattern in the stretchable base material, and
   a width dimension of the surrounding portion is 2 mm or less.

6. The stretchable circuit board according to claim 1, wherein at least a part of the stretchable conductive pattern is a coil wiring formed in a spiral shape.

7. The stretchable circuit board according to claim 1, wherein the stretchable conductive pattern is an antenna pattern that functions as an antenna.

8. The stretchable circuit board according to claim 1, further comprising a magnetic shield layer disposed to cover at least the part of the formation region of the stretchable conductive pattern in the stretchable base material in a plan view, and directly or indirectly laminated on the stretchable base material.

9. The stretchable circuit board according to claim 8, further comprising an adhesive layer that is directly or indirectly laminated on a surface of the reinforcing base opposite to the stretchable base material side, wherein
   the magnetic shield layer is interposed between the adhesive layer and the reinforcing base.

10. The stretchable circuit board according to claim 1, further comprising an adhesive layer that is directly or indirectly laminated on a surface of the reinforcing base opposite to the stretchable base material side.

11. The stretchable circuit board according to claim 1, wherein the reinforcing base surrounds the formation region of the stretchable conductive pattern in the stretchable base material over a range of 240 degrees or more.

12. The stretchable circuit board according to claim 11, wherein the reinforcing base surrounds the formation region of the stretchable conductive pattern in the stretchable base material over an entire circumference of the formation region.

* * * * *